US012578369B2

(12) United States Patent
Matthews et al.

(10) Patent No.: US 12,578,369 B2
(45) Date of Patent: Mar. 17, 2026

(54) DETECTING REMOVAL OF A MODULAR COMMUNICATION CARD FROM A UTILITY METER

(71) Applicant: Landis+Gyr Innovations, Inc., Alpharetta, GA (US)

(72) Inventors: Justin Clifford Matthews, Arncliffe (AU); Akhil Kumar Gupta, Greater Noida (IN); Govind Kharangate, Rosebery (AU); Paul Collins, Bexley (AU)

(73) Assignee: Landis+Gyr Technology, Inc., Alpharetta, GA (US)

( * ) Notice: Subject to any disclaimer, the term of this patent is extended or adjusted under 35 U.S.C. 154(b) by 40 days.

(21) Appl. No.: 17/032,082

(22) Filed: Sep. 25, 2020

(65) Prior Publication Data

US 2022/0099715 A1 Mar. 31, 2022

(51) Int. Cl.
*G01R 22/06* (2006.01)
*G06K 7/00* (2006.01)
(52) U.S. Cl.
CPC ......... *G01R 22/068* (2013.01); *G01R 22/065* (2013.01); *G06K 7/0026* (2013.01)
(58) Field of Classification Search
CPC .................................................. G01R 22/068
See application file for complete search history.

(56) References Cited

U.S. PATENT DOCUMENTS 6,362,745 B1 * 3/2002 Davis ................... G01R 22/066
340/637
2001/0038343 A1 11/2001 Meyer et al.
(Continued)

FOREIGN PATENT DOCUMENTS

CN 110445245 A 11/2019
WO 2009/086432 A1 7/2009

OTHER PUBLICATIONS

International Patent Application No. PCT/US2021/050872, International Search Report and Written Opinion mailed Dec. 8, 2021, 11 pages.
Office Action, Chinese Patent Application No. 202180063467.9, Dec. 27, 2025, 25 pages.

* cited by examiner

*Primary Examiner* — Hyun D Park
(74) *Attorney, Agent, or Firm* — Kilpatrick Townsend & Stockton LLP

(57) ABSTRACT

Techniques described enable a modular communication card to alert of its removal from a device. A method described herein includes monitoring, at a modular communication card for sending communications from a utility meter, a power fail signal received from a card of the utility meter. According to the method, the modular communication card monitors a power supply signal that supplies power to components of the modular communication card while the modular communication card is installed on the utility meter. The method includes detecting a change in the power fail signal, indicating a loss of power. The method further includes detecting that the power supply signal is outside an operational voltage range. The method further includes, responsive to the change and the power supply signal being outside, determining that the modular communication card has been removed from the utility meter. Additionally, the method includes transmitting an alert indicating the removal.

8 Claims, 4 Drawing Sheets

(56) References Cited

U.S. PATENT DOCUMENTS

| | | | |
|---|---|---|---|
| 2011/0169659 A1* | 7/2011 | Dalla | H04L 12/2836 |
| | | | 340/870.02 |
| 2013/0119974 A1* | 5/2013 | Chamarti | G01R 22/066 |
| | | | 324/110 |
| 2017/0269131 A1 | 9/2017 | Yokota et al. | |

DETECTING REMOVAL OF A MODULAR COMMUNICATION CARD FROM A UTILITY METER

TECHNICAL FIELD

Implementations described herein relate to utility meters and, more particularly, to detecting the removal of a modular communication card from a utility meter.

BACKGROUND

A utility meter measures the consumption of a resource associated with a premises. Typically, the utility meter transmits consumption data, which describes the measured consumption, to a centralized headend system. A utility service provider can then bill a user associated with the premises based on the consumption data as received at the headend system. Thus, to ensure proper billing, the utility meter needs to be able to communicate with the headend system. In some cases, the utility meter utilizes a modular communication card to facilitate such communications.

Communication technologies are constantly changing and improving, and a utility meter is likely to have a lifespan that exceeds the popularity of a particular communication technology. Modular communication cards are useful to provide easily changeable and upgradeable communication technologies in a utility meter. A modular communication card implements one or more communication technologies and is installable into a utility meter to enable the utility meter to utilize the one or more communication technologies of the modular communication card. For example, a modular communication card that implements 5G communications could be installed into a utility meter that was not built for 5G communications and may therefore enable the utility meter to communicate over a 5G network. When a utility service provider wishes to upgrade the communication technology of the utility meter, the utility service provider can have a field technician swap out the modular communication card for a different modular communication card that implements a different communication technology.

SUMMARY

Some implementations described herein include a method for alerting of removal of a modular communication card from a utility meter. The method includes monitoring, at a modular communication card configured to send communications on behalf of a utility meter, a power fail signal received from a card of the utility meter. The method further includes monitoring, at the modular communication card, a power supply signal, where the power supply signal supplies power to components of the modular communication card while the modular communication card is installed on the utility meter. The method includes detecting a change in the power fail signal, where the change in the power fail signal indicates a loss of power. The method further includes detecting that the power supply signal is outside an operational voltage range. The method further includes, responsive to the change in the power fail signal and the power supply signal being outside the operational voltage range, determining that the modular communication card has been removed from the utility meter. Additionally, the method includes transmitting, by a radio of the modular communication card, an alert indicating the removal of the modular communication card from the utility meter.

In some implementations, a modular communication card is configured to send communications on behalf of a device, such as a utility meter. The modular communication card includes a power fail input, a power supply input, a radio, and a controller. The power fail input is configured to receive a power fail signal from a device, such as a utility meter. The power supply input is configured to receive from the device a power supply signal that powers components of the modular communication card while the modular communication card is installed on the device. The controller is configured to detect a change in the power fail signal, where the change in the power fail signal indicates a loss of power, and to detect that the power supply signal is outside an operational voltage range. The controller is further configured, responsive to the change in the power fail signal and the power supply signal being outside the operational voltage range, to determine that the modular communication card has been removed from the device. The controller is further configured to direct the radio to transmit an alert indicating the removal of the modular communication card from the device.

In some implementations, a system includes a utility meter and a modular communication card. The utility meter is configured to measure consumption of a resource and further configured to utilize a module installed on the utility meter. The modular communication card is configured to send communications on behalf of the utility meter. The modular communication card includes a power fail input, a power supply input, a radio, and a controller. The power fail input is configured to receive a power fail signal from the utility meter. The power supply input is configured to receive from the utility meter a power supply signal that powers components of the modular communication card while the modular communication card is installed on the utility meter. The controller is configured to detect a change in the power fail signal, where the change in the power fail signal indicates a loss of power, and to detect that the power supply signal is outside an operational voltage range. The controller is further configured, responsive to the change in the power fail signal and the power supply signal being outside the operational voltage range, to determine that the modular communication card has been removed from the utility meter. The controller is further configured to direct the radio to transmit an alert indicating the removal of the modular communication card from the utility meter.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Conventionally, there is no automated mechanism to detect when a modular communication card, also referred to herein as a communication card, is removed from a utility meter. As a result, a user could remove the communication card from a utility meter, and the utility meter would not be able to send some or all communications, potentially including communications related to consumption of a resource measured by the utility meter. This could result in a reduced charge to the user for that consumption since certain information about consumption is not transmitted to the headend system. Further, while the communication card is removed, the user could tamper with the meter further, and such tampering would not be communicated to the headend system due to the meter not having access to a communication card.

In some implementations, an alert system described herein is integrated into a modular communication card and, thus, enables the modular communication card to detect removal from a utility meter and to transmit an alert indicating such removal. For instance, the alert system may include an electrical energy storage device, a detection circuit, a decision engine, and a boost circuit, where the detection circuit and the decision engine may be integrated into a microcontroller unit of the modular communication card. Generally, the electrical energy storage device, such as a supercapacitor, may provide power to enable the alert system to operate when the communication card stops receiving power from the utility meter; the detection circuit may detect a change in a power fail signal, where that change indicates a loss of power; the decision engine may decide whether the loss of power is due to removal of the communication card from the utility meter; and the boost circuit may boost the voltage from the electrical energy storage device to provide sufficient voltage to enable the communication card to transmit an alert of the removal. Implementations described herein provide an improvement in the technical field of utility meters by enabling a communication card of a utility meter to transmit an alert indicating its own removal; there is no conventional automated mechanism for alerting a headend system that a communication card has been removed.

Figure 1:
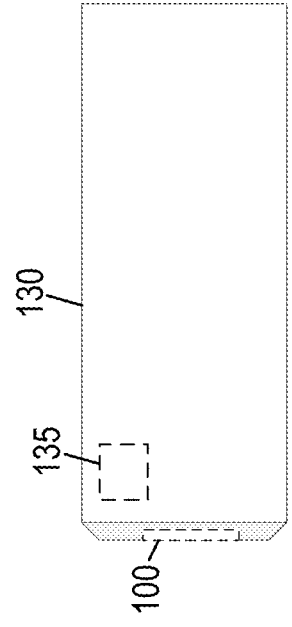
FIG. 1 is a diagram of a utility meter and a modular communication card, where the modular communication card is installable into the utility meter, according to some implementations described herein.
Figure 1:
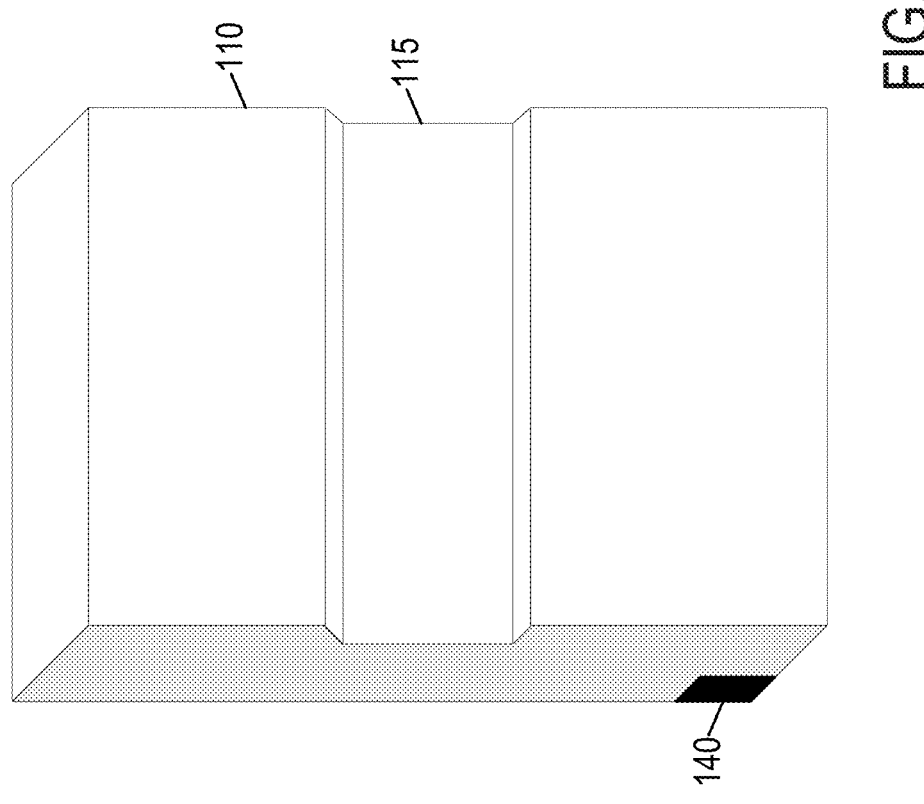

FIG. 1 is a diagram of a utility meter 110 and a modular communication card 130, where the modular communication card 130 is installable into the utility meter 110, according to some implementations described herein. In some implementations, the utility meter 110, also referred to as a meter 110, measures consumption of a resource on a premises and transmits consumption data describing that consumption to a headend system.

To measure consumption of the resource, the meter 110 may include a metrology engine, also referred to as a metrology card, not shown in FIG. 1. In some implementations, the metrology engine measures resource consumption and stores an indication of that consumption in consumption data. Periodically, the meter 110 may transmit that consumption data to the headend system. To this end, the meter 110 may utilize the communication card 130, as described further below.

In some implementations, the utility meter 110 communicates various other information to the headend system additionally or alternatively to the consumption data, such as information about the health of a network to which the utility meter 110 is connected. The headend system may provide various services to the utility meter 110. For instance, the headend system may collect consumption data from various utility meters, such as the utility meter 110 described herein, to bill users associated with those utility meters, or the headend system may manage the health of the network to which the utility meter 110 is connected.

The utility meter 110 may include one or more module slots 115 or other engagement devices (e.g., a cable) configured to engage with a modular device for installation of the modular device on the utility meter 110. In some implementations, a module slot 115 is configured to receive a modular device to enable installation of the modular device into the utility meter 110. When a modular device is installed in the utility meter 110, such as through insertion into or other engagement with a module slot 115, or other engagement device, of the utility meter 110, the utility meter 110 can utilize the functionality of the modular device. In some implementations, however, when the modular device is removed from the utility meter 110, such as by removal or disengagement from the module slot 115 or other engagement device, the functionality of the modular device is no longer be available to the meter 110.

In some implementations, a modular communication card 130, as shown in FIG. 1, is a modular device configured to be installed into the utility meter 110 or another device, such as through engagement with a module slot 115 of the utility meter 110. The modular communication card 130, also referred to herein as a communication card 130, implements one or more specific functionalities (e.g., communication) and can be installed into or removed from the meter 110 to respectively install or remove the specific functionalities implemented by the communication card 130. Further, in some implementations, the communication card 130 is configured for easy installation, such as in a module slot 115, and removal to enable the communication card 130 to be installed, removed, or swapped with another modular device as desired by the utility service provider.

In some implementations, the communication card 130 has a radio 135 capable of one or more communication technologies. For instance, the radio 135 is configured to communicate using one or more of the following or other communication technologies: 4G, 5G, ZigBee, Wireless Fidelity (Wi-Fi), or Wireless Smart Ubiquitous Network (Wi-SUN). The communication card 130 may be configured to engage with, and thus connect to, the utility meter 110 for installation of the communication card 130 into the utility meter 110. When the communication card 130 is installed on the utility meter 110, the meter 110 has access to the functionalities of the communication card 130, specifically, the ability to transmit communications using the radio 135. To this end, when the communication card 130 is installed on the meter 110, the communication card 130 and the metrology engine of the utility meter 110 may communicate with each other over a meter interface, which may enable power and digital signals to be passed between the metrology engine and the communication card 130. The communication card 130 can thus send transmissions, such as transmissions of consumption data, on behalf of the utility meter 110 and, more specifically, on behalf of the metrology engine or other components of the utility meter 110.

When installed on the meter, the communication card 130 may act as a radio of the meter 110 and may thus enable the meter 110 to communicate with the headend system or other devices, such as to enable transmission of the consumption data. However, if a user tampers with the meter 110 by removing the communication card 130, then the meter 110 may be unable to reach the headend system. For instance, the meter 110 may be unable to the headend system consumption data determined by the metrology engine.

In some implementations, as shown in FIG. 1, the communication card 130 includes an alert system 100 configured to detect and alert of removal of the communication card 130 from the utility meter 110. An alert of removal can enable the utility service provider to take remedial action with respect to the utility meter 110 or with respect to a user account associated with that utility meter 110. It will be understood that the location of the alert system 100 on the communication card 130, as shown in FIG. 1, is provided for illustrative purposes only and that aspects of the alert system 100 may be located at other positions or distributed across multiple positions of the communication card 130.

In some implementations, the communication card 130 is implemented as a hardware device, which may include hardware, software (e.g., firmware), or a combination of hardware and software. For instance, the communication card 130 may include program code stored in a computer-readable medium, which may be volatile memory, nonvolatile storage, or both. In some implementations, the computer-readable medium is a non-transitory computer-readable medium. A processing unit, or controller, of the communication card 130 may execute the program code to implement operations described herein, such as operations performed to transmit communications via the radio 135. In some implementations, the alert system 100 is integrated with the communication card 130 and is implemented on the communication card 130 as hardware, software (e.g., firmware), or a combination of hardware and software. The alert system 100 may run on the communication card 130 such that the alert system 100 may utilize the capabilities of the communication card 130 to detect removal of the communication card 130 from the meter 110 and to transmit an alert indicating the removal of the communication card 130. For instance, in some implementations, the processing unit of the communication card 130 is a microcontroller unit (MCU) that includes logic, implemented as hardware or stored as program code in a computer-readable medium, to perform aspects of the alert system 100 described herein.

As shown in FIG. 1, in some implementations, the utility meter 110 includes a power supply 140, which receives AC power from an AC power line and converts that AC power to DC power to power various internal devices of the utility meter 110. For instance, the power supply 140 provides power to the communication card 130 to enable standard operation of the communication card 130, such as receiving and transmitting data for the meter 110. Further, the power supply 140 may charge an electrical energy storage device, such as a supercapacitor, which may be included in the alert system 100 to power the communication card 130, and thereby to power the alert system 100 itself, when the communication card 130 experiences a power failure such that the communication card 130 can no longer receive power from the meter 110. The communication card 130 may experience this power failure due to a power outage at the meter 110, as in the case of a blackout in which a power grid of the meter 110 goes down, or due to the communication card 130 being removed from the utility meter 110.

In either case, upon a power failure, the communication card 130 receives an indication of the power failure from the meter, specifically, in the form of a change to a power fail signal from the meter in some implementations. As described in detail below, based on the change to the power fail signal, the communication card 130 may activate the alert system 100, which may determine whether the power failure was due to removal of the communication card 130 from the utility meter 110 or due to a power outage at the utility meter 110. The alert system 100 may then send one or more alerts to the headend system or other remote device indicating the reason for the power failure (e.g., removal of the communication card 130).

Although FIG. 1 illustrates a meter 110 having a certain form factor, which is generally rectangular, the implementations described herein are not limited to meters 110 having this form factor. For example, the meter 110 may be an American National Standards Institute (ANSI) meter or another meter with a similar shape as an ANSI meter, which has a cylindrical shape. Further, although a module slot 115 for a meter 110 as shown in FIG. 1 is illustrated as being outside a housing of the meter 110, in an alternative implementation, the meter 110 may include a module slot 115 internal to a housing of the meter 110, such that the meter 110 may need to be opened for installation or uninstallation of the communication card 130. Thus, the connection between the meter 110 and the communication card 130 may be internal or external to a housing of the meter 110. Various implementations are within the scope of this disclosure.

Further, although this disclosure refers to the communication card 130 as being installed in and removable from a utility meter 110 in particular, the implementations described herein are not limited to that context. Rather, the communication card 130 can be installed in some other device, such as an Internet of Things (IoT) device. In that case, the alert system 100 of the communication card 130 may enable the communication card 130 to detect removal from the device in which the communication card 130 is configured to be installed. Thus, it will be understood that references to a utility meter 110 herein are for illustrative purposes only.

Figure 2:
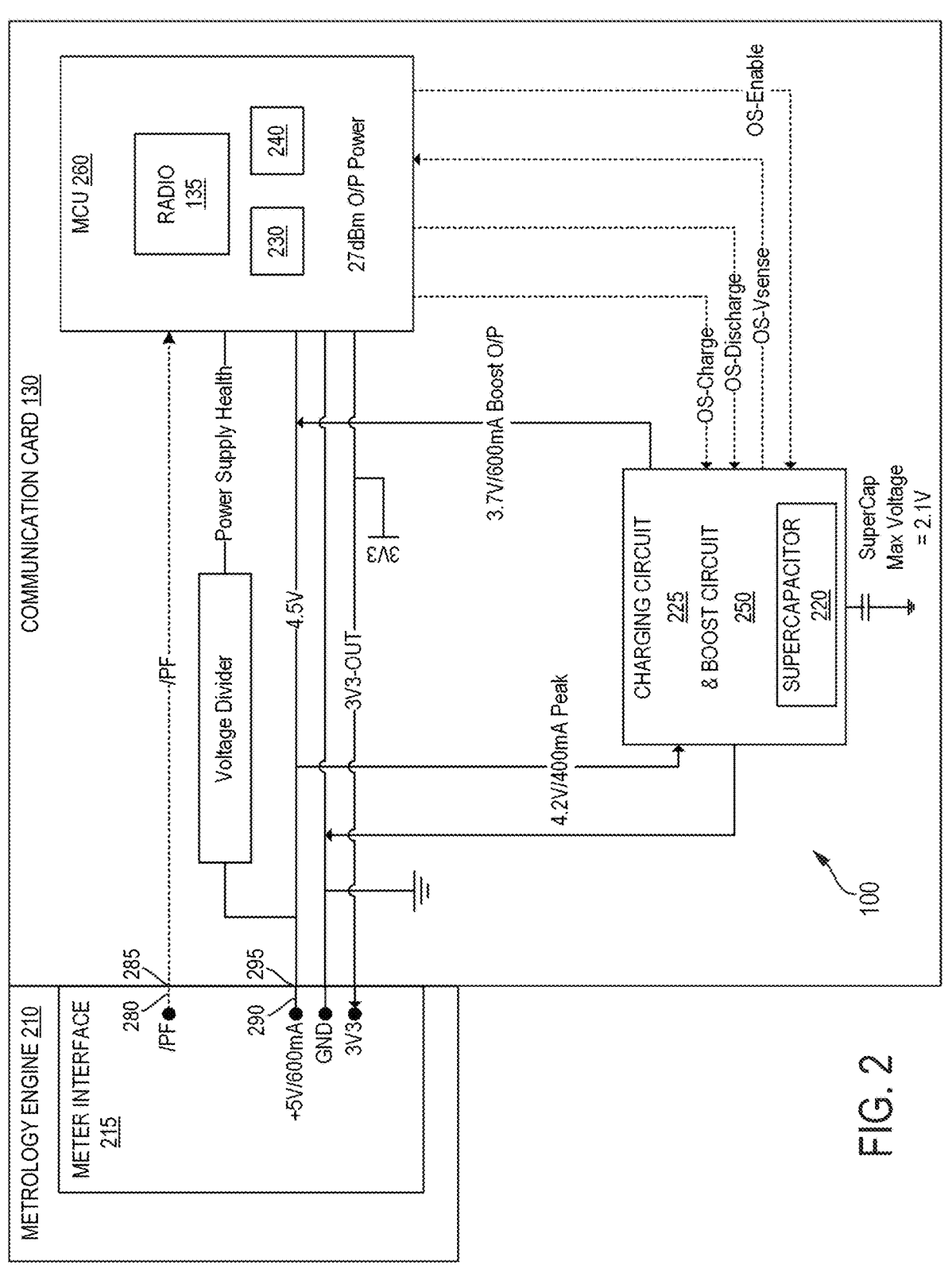
FIG. 2 is a diagram of an alert system of the modular communication card, according to some implementations described herein.

FIG. 2 is a diagram of the alert system 100 of the communication card 130, according to some implementations described herein. As shown in FIG. 2, in some implementations, the alert system 100 includes an electrical energy storage device, such as a supercapacitor 220 in this example; a detection circuit 230; a decision engine 240; and a boost circuit 250 or alternatively a step-down voltage regulator (not shown). Generally, the supercapacitor 220 may provide power needed by the alert system 100 to perform the tasks described herein, the detection circuit 230 may detect a change in a power fail signal 280 indicating a loss of power, the decision engine 240 may decide whether the loss of power is due to removal of the communication card 130 from the utility meter 110, and the boost circuit 250 may boost the voltage from the supercapacitor 220 to provide sufficient voltage to enable the communication card 130 to transmit the one or more alerts. As discussed above, the alert system 100 may reside on the communication card 130, and thus in some implementations, the supercapacitor 220, the detection circuit 230, the decision engine 240, and the boost circuit 250 reside on the communication card 130 as shown in FIG. 2.

Each of the detection circuit 230 and the decision engine 240 may be implemented as hardware, software (e.g., firmware), or a combination of both. For instance, each of the detection circuit 230 and the decision engine 240 may be a specialized hardware device integrated with the communication card 130, one or more software functions configured to run on the communication card 130, or some combination of these or other hardware or software. In some implementations, as in the example of FIG. 2, the detection circuit 230 and the decision engine 240 are integrated with a controller, specifically an MCU 260, of the communication card 130. Thus, tasks described herein as being performed by the detection circuit 230, such as detecting the power fail signal 280 and thus the change to the power fail signal 280, or by the decision engine 240, such as determining the reason for a power failure, are performed by the MCU 260 in this example. Additionally, in the example of FIG. 2, the radio 135 is integrated with the MCU 260 of the communication card 130. In an alternative implementation, one or both of the detection circuit 230 and the decision engine 240 may be implemented as separate devices from the MCU 260. Various implementations are within the scope of this disclosure.

FIG. 2 illustrates power and digital connections between the metrology engine 210 of the meter 110 and the communication card 130 of the meter 110 as well as within the communication card 130, according to some implementations. FIG. 2 and the corresponding description below provide a non-limiting example for illustrative purposes only. The power connections are shown with solid lines, and the digital data and control connections are shown with dashed lines. For instance, the power fail signal 280, which is received at a power fail input 285 of the communication card 130, is shown as a dashed line, and the power supply signal 290, which is received at a power supply input 295 of the communication card 130, is shown as a solid line. Additionally, in FIG. 2, the boost circuit 250 and a charging circuit 225 for the supercapacitor 220 share a diagram block for the sake of illustration.

As shown in FIG. 2, a meter interface 215, which is integrated with the metrology engine 210, connects the metrology engine 210 of the meter 110 to the communication card 130 of the meter 110. In some implementations, the meter interface 215 delivers power and digital information between the metrology engine 210 and the communication card 130.

When the meter 110 powers up, an AC power line supplies power to the power supply 140 of the meter 110. Then a microcontroller of the metrology engine 210 checks that the input power to the power supply 140 is stable. Once the input power is stable, the metrology engine 210 supplies power to the communication card 130 via a power supply signal 290 from the power supply 140, where that power supply signal 290 is received at a power supply input 295 of the communication card 130. The power supply signal 290 may be five volts, for example. Additionally, the microcontroller of the metrology engine 210 changes the power fail signal 280, labeled/PF in FIG. 2, to the communication card 130 from LOW to HIGH. The communication card 130 then begins normal operation. During normal operation (i.e., when the meter 110 is on and the communication card 130 is installed in the meter 110), as shown in FIG. 2, the power supply signal 290 connects to various components of the communication card 130, to provide power to these various components.

In some implementations, upon receiving the power supply signal 290, the MCU 260 of the communication card 130 initiates charging of the supercapacitor 220. In this example, charging of the supercapacitor 220 is controlled by a general-purpose input/output, labeled OS-Charge in FIG. 2. Specifically, to charge the supercapacitor 220, the MCU 260 changes the state of OS-Charge from LOW to HIGH, and as a result, the charging circuit 225, which receives the power supply signal 290, begins charging the supercapacitor 220.

During normal operation of the utility meter 110 with the communication card 130 installed, the MCU 260 of the communication card 130 monitors the supercapacitor voltage through an analog-to-digital converter pin, which is labeled OS-Vsense in FIG. 2. The communication card 120 continues charging the supercapacitor 220 until the voltage of the supercapacitor 220 reaches a threshold voltage, such as 2.1 volts. Responsive to the supercapacitor 220 reaching the threshold voltage, the MCU 260 of the communication card 130 pulls the OS-Charge signal from HIGH to LOW to stop the charging circuit 225 from further charging the supercapacitor 220. The MCU 260 is configured to use an OS-Discharge signal, shown n FIG. 2, as needed to initiate discharging of the supercapacitor 220, for instance, at high temperatures.

In an alternative implementation, the MCU 260 changes the state of OS-Charge from LOW to HIGH rather than from HIGH to LOW responsive to the supercapacitor 220 reaching the threshold voltage, and in that case, the MCU 260 previously caused the charging circuit 225 to begin charging the supercapacitor 220 by changing the state of OS-Charge from HIGH to LOW. It will be understood that these and other levels mentioned in this example are for illustrative purposes only and that various implementations are possible and within the scope of this disclosure.

When the meter 110 experiences a power outage, the microcontroller of the metrology engine 210 changes the power fail signal 280, such as by pulling the power fail signal 280 from HIGH to LOW. As mentioned above, in some implementations, the detection circuit 230 of the alert system 100 detects the change to the power fail signal 280; for instance, the detection circuit 230 may be a hardware circuit configured to detect the falling edge on the power fail signal 280 sent from the meter 110 over the meter interface 215. In the example of FIG. 2, the detection circuit 230 is integrated with the MCU 260 of the communication card 130. As such, in the example of FIG. 2, the MCU 260 of the communication card 130 interprets the transition of the power fail signal 280 to LOW as an indication of a power loss (i.e., a power failure). Responsive to detecting the change to the power fail signal 280, the MCU 260 of the communication card 130 enables the boost circuit 250 by changing the state of OS-Enable from LOW to HIGH.

Additionally, responsive to the change in the power fail signal 280, the MCU 260 of the communication card 130 checks the health of the power supply signal 290, which may be five volts input, from the meter 110. Initially, after detecting the change in the power fail signal 280 in the case of a power outage, the MCU 260 of the communication card 130 sees a healthy voltage (i.e., a voltage within an operational voltage range), such as five volts, coming from meter 110 via the power supply signal 290 for a short period, which may be at least two hundred milliseconds. After this short period, the metrology engine 210 no longer provides power to the communication card 130.

The decision engine 240, which is integrated with the MCU 260 in this example, may determine the reason for the power failure based on whether the power supply signal 290 remains healthy. Specifically, in some implementations, the decision engine 240 determines whether the power failure is due to a power outage at the meter 110 or due to removal of the communication card 130 from the meter 110. In this case, the decision engine 240 may decide that the power failure is due to a power outage at the meter 110 because the communication card 130 continues to receive a healthy power supply signal 290 for a short period (e.g., at least two hundred milliseconds) after the change in the power fail signal 280.

The meter 110 may be configured to continue to provide power to its internal components for a short period (e.g., two hundred milliseconds) after a loss of power through the AC power line. For instance, capacitance at the line side of a regulator in the power supply 140 may provide energy that is voltage regulated and delivered to the communication card 130 even after the AC power line stops delivering power. As such, if the AC power line stopped delivering power, as in the case of a power outage, then the meter 110 would continue to deliver a healthy power supply signal 290 to the communication card 130 for that short period. As a result, in some implementations, whether the power supply signal 290 is detected shortly after the change in the power fail signal 280 is an indication of whether the communication card 130 is still installed in the meter 110, in which case the power supply signal 290 would be healthy, or has been removed, in which case the power supply signal 290 would have ended abruptly and would not be healthy (i.e., would be outside an operational voltage range). In this case, the power failure occurred due to a power outage of the meter, and thus, the power supply signal 290 is detected as healthy.

The boost circuit 250 is enabled through the OS-Enable signal from the MCU 260 of the communication card 130, and as a result, the boost circuit 250 starts switching when the power supply signal 290 falls to a low threshold, such as 3.7 volts, for example, at which point the boost circuit 250 begins regulating its output voltage. The boost circuit 250 remains active while the voltage of the supercapacitor 220 increases to a minimum operating voltage, which is sufficient for operating the boost circuit 250. In some implementations, the boost circuit 250 boosts the supercapacitor voltage at this point.

The radio 135 may require a specific voltage input, and without use of the boost circuit 250, the supercapacitor voltage may be insufficient for operation of the radio 135. As such, as described above, the boost circuit 250 may boost the supercapacitor voltage and may output a boosted voltage. The boosted voltage may be input to the radio 135. This boosted voltage is sufficient to enable the radio 135 to send one or more alerts, in some implementations. Additionally or alternatively, the supercapacitor 220 may provide a higher voltage than needed for the radio 135, and in that case, the MCU 260 may activate a step-down voltage regulator to down-convert the supercapacitor 220 voltage to a lower voltage for input to the radio 135. However, this technique may be less efficient than utilizing the boost circuit 250 to boost the voltage. Additionally or alternatively, the alert system 100 may use a battery-boost combination rather than the supercapacitor-boost combination shown in FIG. 2. Other implementations may be used and are within the scope of this disclosure. The communication card 130 may continue to send alerts via the radio 135 regarding the power failure for more than two minutes after the meter loses power using the architecture shown in FIG. 2.

In contrast to the above activities that occur when the meter 110 loses power, as soon as the communication card 130 is removed from the meter 110 during normal operation of the meter 110, connectivity is lost with respect to both the power fail signal 280 and the power supply signal 290. Due to an external pull down (i.e., external to the MCU 260) on the power fail signal 280, the MCU 260 of the communication card 130 sees a transition from HIGH to LOW on the power fail signal 280. In response to the change in the power fail signal 280, the MCU 260 of the communication card 130 changes the state of OS-Enable from LOW to HIGH to enable the boost circuit 250.

In some implementations, the decision engine 240 may decide that the power failure is due to removal from the meter 110 if the power supply signal 290 is absent right after detection of the power failure signal 280. In this example, the MCU 260 of the communication card 130 can no longer detect a minimum voltage on the power supply signal 290, and as a result, the MCU 260 determines that the communication card 130 has been removed from the meter 110. The boost circuit 250 was activated through the OS-Enable signal from the MCU 260 of the communication card 130, and as a result, the boost circuit 250 starts switching when the power supply signal 290 falls to a low threshold, such as 3.7 volts, for example, at which point the boost circuit 250 begins regulating its output voltage. This enables the output of the boost circuit 250 to power the MCU 260 of the communication card 130 to utilize the radio 135 to transmit alerts of the communication card removal.

Thus, in some implementations, regardless of whether the loss of power is due to a power outage or to removal of the communication card 130 from the meter 110, the alert system 100 detects the change in the power fail signal 280 and enables the boost circuit 250. However, the timing for activation of the boost circuit 250 can vary based on the reason for the power failure. For instance, when there is a power outage at the meter 110, the power supply signal 290 remains healthy for a short period, and as a result, the power supply signal 290 remains above the low threshold and the boost circuit 250 is not activated until the end of this short period. However, when the communication card 130 is removed from the meter 110, the power supply signal 290 abruptly falls to the low threshold without a delay of that short period, and as a result, the boost circuit 250 is activated sooner in that case.

Figure 3:
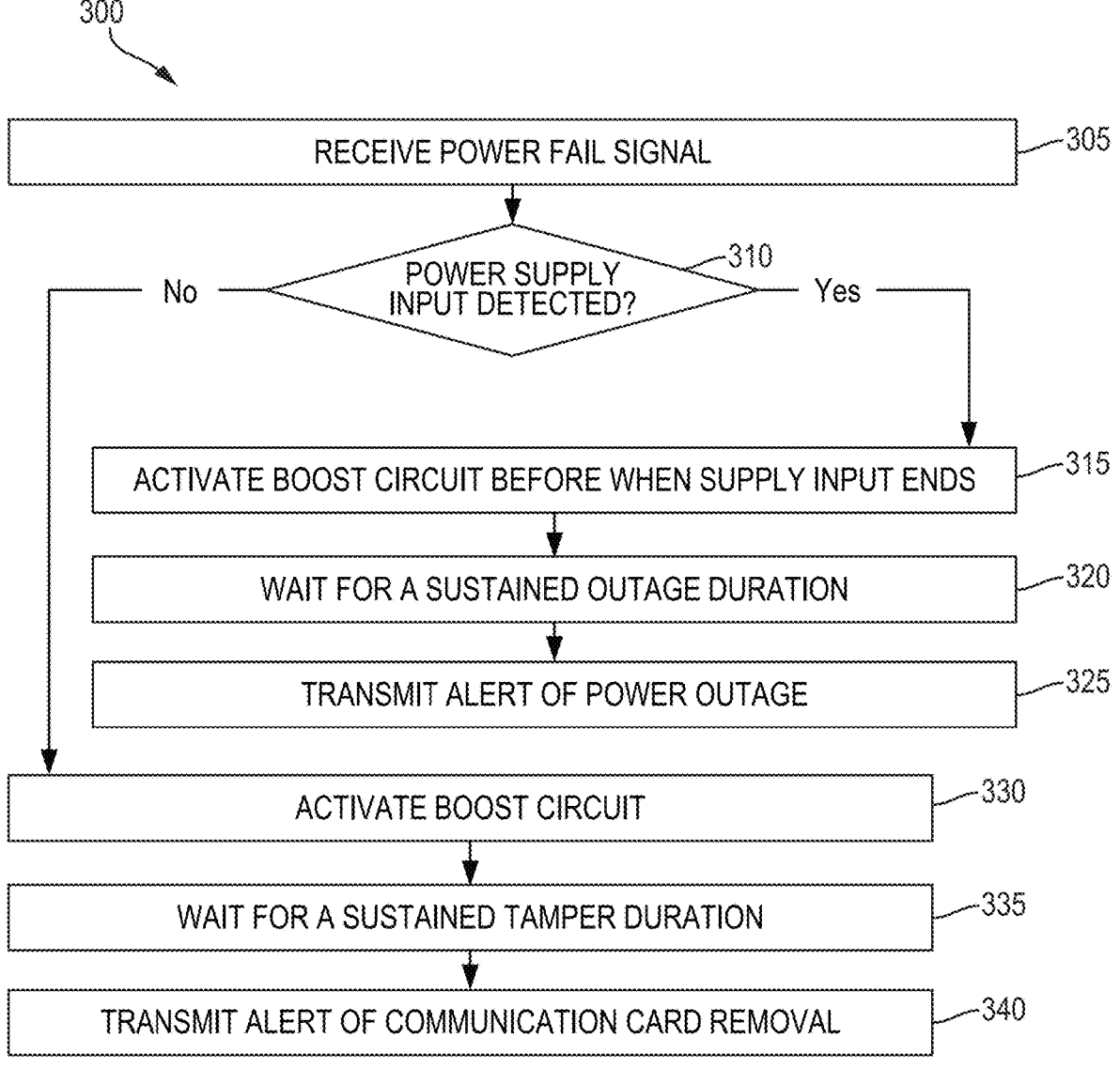
FIG. 3 is a diagram of a method of generating an alert, by the alert system of the modular communication card, according to some implementations described herein.

FIG. 3 is a diagram of a method 300 of generating an alert, or notification, indicating a power failure due to a power outage or removal of the communication card 130, according to some implementations described herein. In some implementations, the alert system 100 of the communication card 130 performs this method 300 or similar when a change in the power fail signal 280 is detected.

At block 305, the communication card 130 detects a change in the power fail signal 280. In some implementations, a change the power fail signal 280, such as a transition from HIGH to LOW or from LOW to HIGH, indicates to the communication card 130 that a power failure has occurred; for instance, the meter 110 is experiencing a power outage, or the communication card 130 has been removed from the meter 110. In some implementations, the change in the power fail signal 280 triggers the alert system 100, which may perform the remainder of this method 300.

In some implementations, responsive to the change in the power fail signal 280, the decision engine 240 determines the reason for the power failure indicated by the power fail signal 280. To this end, at decision block 310, the decision engine 240 determines whether the communication card 130 is still receiving a healthy power supply signal 290 (i.e., above a low threshold) from the meter 110. In the case of removal of the communication card 130 from the meter 110, the power supply signal 290 would abruptly end and therefore would not be detected during this method 300. However, in the case of a power outage at the meter 110, the power supply signal 290 would remain healthy for a short period after the change in the power fail signal 280.

If power supply signal 290 is detected as healthy, then the method 300 proceeds to block 315. However, if the power supply signal 290 is not detected as healthy, then the method 300 skips ahead to block 330.

Block 315 is the beginning of a set of activities performed by the alert system 100 of the communication card 130 based on the determination that power supply signal 290 is still being received and is still healthy. As described above, input from the power supply 140 indicates an ongoing connection with the meter 110, and as such, the decision engine 240 decides that a power outage has occurred. Thus, at block 315, the communication card 130 may activate the boost circuit 250 after a short period, for instance, when the power supply signal 290 is eventually deemed unhealthy (i.e., deemed to be outside an operational voltage range). In some implementations, in the case of a power outage, the power supply signal 290 remains healthy for a short period, such for at least the first two hundred milliseconds after the change in the power fail signal 280, after which the boost circuit 250 is activated. When activated, the boost circuit 250 may boost the voltage from the supercapacitor 220, thereby providing sufficient voltage to enable the communication card 130 to transmit data, such as one or more alerts.

At block 320, the communication card 130 waits for a sustained outage duration, which may be predefined and preprogrammed in the communication card 130. In some implementations, the sustained outage duration is used to ensure that the meter 110 truly has lost power and that the power loss is of a length for which reporting is useful. For example, the sustained outage duration may be on the order of a few seconds or a few minutes.

At block 325, when the sustained outage duration ends, the communication card 130 may transmit an alert indicating that there has been a power outage at the meter 110. For instance, the communication card 130 may transmit the alert to the headend system. In some implementations, the communication card 130 repeatedly transmits alerts indicating the power outage for as long as the supercapacitor 220 allows (e.g., until the supercapacitor 220 lacks the energy to support transmission of another alert) or until the power outage ends.

Block 330 is the beginning of a set of activities performed by the communication card 130 based on the determination that power supply signal 290 is not healthy. As described above, lack of healthy input from the power supply 140 indicates loss of the connection with the meter 110, and as such, the decision engine 240 decides that the communication card 130 has been removed from the meter 110. Thus, at block 330, the communication card 130 may activate the boost circuit 250, for instance, immediately or without waiting for a short period of delay. In some implementations, the boost circuit 250 may require a short duration, for instance, less than one hundred microseconds, to start up and to regulate its output voltage after activation.

At block 335, the communication card 130 waits for a sustained tamper duration, which may be predefined and preprogrammed in the communication card 130. In some implementations, the sustained tamper duration is used to ensure that the communication card 130 truly has been removed and that the removal is for a length for which reporting is useful. For example, the sustained tamper duration may be on the order of a few seconds or a few minutes. In some implementations, the sustained tamper duration need not be equal to the sustained outage duration applied at block 320.

At block 340, when the sustained outage duration ends, the communication card 130 may transmit an alert indicating that the communication card 130 has been removed from the meter 110. For instance, the communication card 130 may transmit the alert to the headend system. In some implementations, the communication card 130 repeatedly transmits alerts indicating the removal for as long as the supercapacitor 220 allows or until the communication card 130 is returned to the meter 110.

Figure 4:
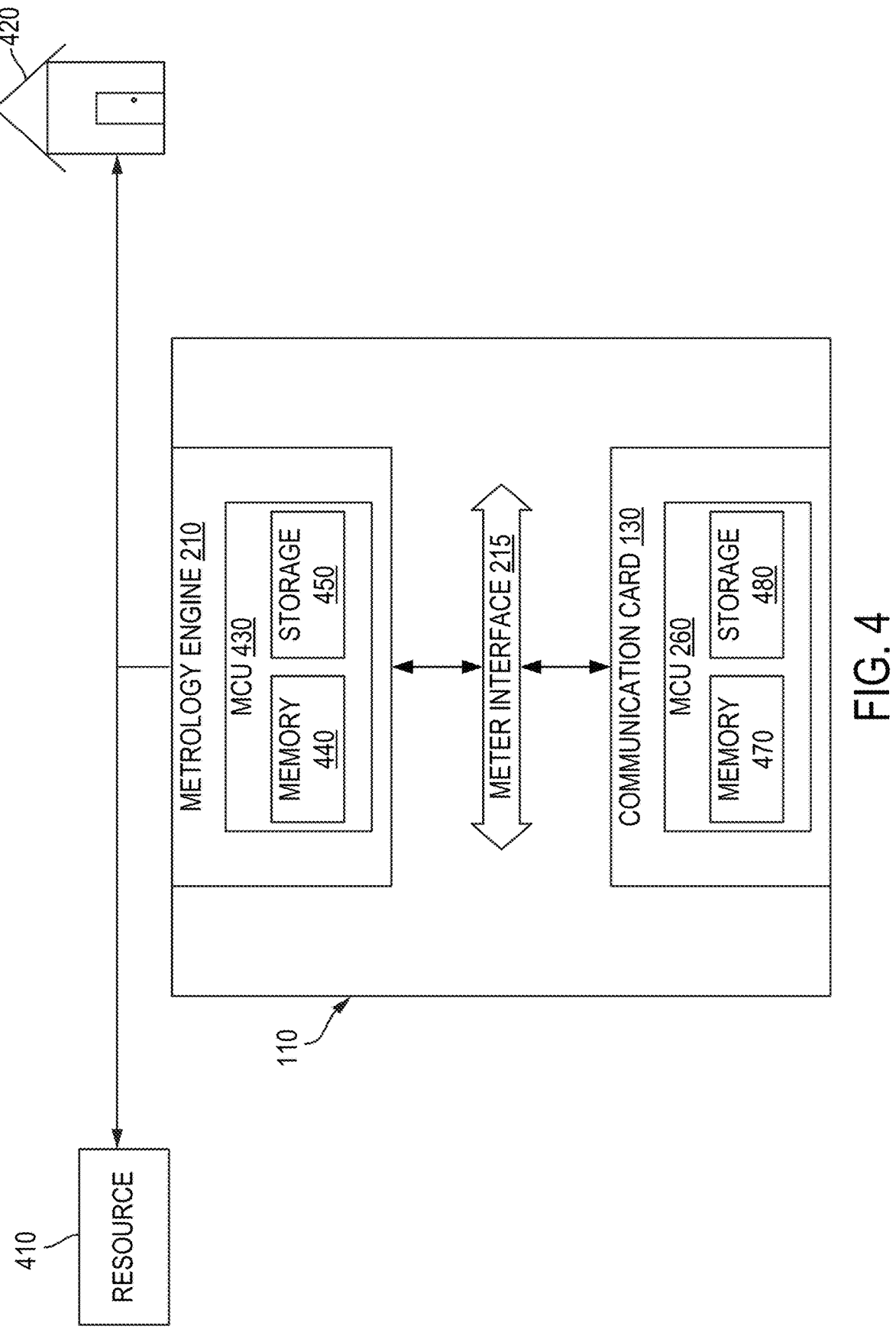
FIG. 4 is a diagram of a utility meter configured to utilize the modular communication card with the alert system, according to some implementations described herein.

FIG. 4 is a diagram of a utility meter 110, according to some implementations described herein. For instance, the utility meter 110 may be a water meter, a gas meter, or another type of meter that measures consumption of a resource 410 and communicates with a headend system or some other remote device. In some implementations, the utility meter 110 is a modular meter 110 configured to utilize installed modules, such as a communication card 130 with an alert system 100 as described herein.

As shown in FIG. 4, an example utility meter 110 measures consumption of a resource 410 occurring on a premises 420. To this end, the utility meter 110 may include a metrology engine 210, also referred to as a metrology card, which detects a signal indicating use of the resource 410 and, based on that signal, determines an amount of that resource 410 consumed on the premises 420. In some implementations, the metrology engine 210 is a modular device installed on the meter 110.

The metrology engine 210 of the utility meter 110 may include a processing unit, such as a microcontroller unit 430, which may include an integrated computer-readable medium such as volatile memory 440 or nonvolatile storage 450, or both. Although the volatile memory 440 and the nonvolatile storage 450 of the metrology engine 210 are shown and described herein as being integrated into the MCU 430 of the metrology engine 210, it will be understood that alternative implementations are within the scope of this disclosure; for instance, the volatile memory 440 and the nonvolatile an storage 450 may be distinct from a processing unit of the metrology engine 210.

In some implementations, operations of the metrology engine 210 to utilize the communication card 130, so as to receive or transmit messages when the communication card 130 is installed in the meter 110, are embodied as hardware logic or as program instructions stored in a computer-readable medium. In some implementations, the computer-readable medium is a non-transitory computer-readable medium. That computer-readable medium is, for example, the volatile memory 440 or the nonvolatile storage 450 of the metrology engine 210. The MCU 430 of the metrology engine 210 may execute the hardware logic or program instructions to implement operations to utilize the communication card 130 or to perform other tasks as may be required for normal operation of the utility meter 110.

In some implementations, as shown in FIG. 4, the meter 110 may include an installed communication card 130, which may be modular and may include an alert system 100 as described herein. In some implementations, the communication card 130 acts as a radio for the utility meter 110. For instance, the communication card 130 may receive consumption data from the metrology engine 210, where the consumption data describes resource consumption, and the communication card 130 may transmit that consumption data to a headend system. The utility meter 110 can but need not include another radio, such as another communication card 130 or a built-in radio, in addition to the communication card 130.

For instance, in some implementations, the utility meter 110 includes at least two modular communication cards 130, including a first communication card 130 and a second communication card 130. In that case, one or more of such communication cards 130 may include a respective alert system 100 as described herein. In one example, only one of the communication cards 130 is active and configured to send transmissions at a given time, and in that case, the respective alert system 100 of the active communication card 130 may send alerts as described herein responsive to a power failure, while an inactive communication card 130 need not send such alerts. Alternatively, each communication card 130 with a respective radio 135 and a respective alert system 100 may send alerts responsive to detecting a power failure; in that case, the redundancy of using multiple instances of the alert system 100 can ensure that the alerts are sent. Various implementations are possible and are within the scope of this disclosure.

The communication card 130 may include an MCU 260 as described above. Further, the MCU 260 may include a computer-readable medium, which may be non-transitory, such as volatile memory 470 or nonvolatile storage 480, or both. In some implementations, the alert system 100 is implemented as executable program instructions stored on a computer-readable medium, such as the volatile memory 470 or the nonvolatile storage. The computer-readable medium may maintain executable program instructions implementing various aspects of the alert system 100, such as controlling the OS-Charge, OS-Discharge, OS-Vsense, and OS-Enable signals. Additionally or alternatively, however, the alert system 100 may be implemented as hardware logic. Although the volatile memory 470 and the nonvolatile storage 480 of the communication card 130 are shown and described herein as being integrated into the MCU 260 of the communication card 130, it will be understood that alternative implementations are within the scope of this disclosure; for instance, the volatile memory 440 and the nonvolatile storage 450 may be distinct from a processing unit of the communication card 130.

In some implementations, a system bus, such as the meter interface 215, connects together the metrology engine 210 and the communication card 130 of the utility meter 110 to enable communications between metrology engine 210 and the communication card 130. Further, the meter interface 205 may connect one or both of the metrology engine 210 and the communication card 130 to one or more other devices of the meter 110, such as other modular devices installed on the meter 110.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter.

Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for alerting of removal of a modular communication card from a utility meter, the method comprising:

monitoring, at a modular communication card configured to send communications on behalf of a utility meter, a digital power fail signal received at a power fail input of the modular communication card from a card of the utility meter, wherein a microcontroller of a metrology engine of the utility meter is configured to change the digital power fail signal from HIGH to LOW when the utility meter experiences a power outage, and a pull down on the digital power fail signal transitions the digital power fail signal on the modular communication card from HIGH to LOW when the modular communication card is removed from the utility meter during normal operation of the utility meter;

monitoring, at the modular communication card, a power supply signal, wherein the power supply signal supplies power to components of the modular communication card while the modular communication card is installed on the utility meter;

charging, at the modular communication card, a supercapacitor using power received from the power supply signal while the modular communication card is installed on the utility meter;

detecting a change in the digital power fail signal, wherein the change in the digital power fail signal indicates a loss of power due to either a power outage or a removal of the modular communication card from the utility meter and activating, by the modular communication card and based on the change to the digital power fail signal, an alert system integrated into the modular communication card, wherein the alert systems is configured such that:

responsive to detecting that the power supply signal is outside an operational voltage range right after the detection of the change in the digital power fail signal:

determining that the loss of power is due to the modular communication card having been removed from the utility meter;

enabling operation of a boost circuit to boost a voltage from the supercapacitor to provide a boosted voltage to a radio of the modular communication card;

waiting for a sustained tamper duration which is pre-defined and preprogrammed in the modular communication card; and transmitting, by the radio of the modular communication card, an alert indicating the removal of the modular communication card from the utility meter, responsive to continuing to receive a power supply signal within the operational voltage range for at least two hundred milliseconds after the change in the digital power fail signal:

determining that the loss of power is due to a power outage;

responsive to the power supply signal being outside the operational voltage range, activating the boost circuit to boost a voltage from the supercapacitor to provide a boosted voltage to the radio of the modular communication card;

waiting for a sustained outage duration which is pre-defined and preprogrammed in the modular communication card; and transmitting, by the radio of the modular communication card, an alert indicating a power outage.

2. The method of claim 1, further comprising down-converting a voltage output of the supercapacitor to provide a down-converted voltage output to the radio of the modular communication card.

3. The method of claim 1, further comprising transmitting one or more additional alerts indicating the removal of the modular communication card from the utility meter, until the supercapacitor lacks energy to support another alert.

4. The method of claim 1, further comprising:

detecting a second change in the digital power fail signal, wherein the second change in the digital power fail signal occurs prior to the change in the digital power fail signal and indicates a second loss of power prior to the loss of power;

detecting that the power supply signal is within the operational voltage range;

responsive to the second change in the digital power fail signal and the power supply signal being within the operational voltage range, determining that a power outage has occurred at the utility meter; and transmitting, by the radio of the modular communication card, a second alert indicating the power outage at the utility meter.

5. The method of claim 4, further comprising:

charging, at the modular communication card, a superca-pacitor using power received from the power supply signal while the modular communication card is installed on the utility meter;

responsive to the power outage at the utility meter, enabling operation of a boost circuit on the modular communication card; and responsive to the power supply signal falling outside the operational voltage range, supplying, by the superca-pacitor and the boost circuit, a boosted voltage to the radio of the modular communication card.

6. A system comprising:

a utility meter configured to measure consumption of a resource; and a modular communication card installed on the utility meter and configured to send communications on behalf of the utility meter, wherein the utility meter is configured to provide a digital power fail signal to a power fail input of the modular communication card, wherein a microcontroller of a metrology engine of the utility meter is configured to change the digital power fail signal from HIGH to LOW when the utility meter experiences a power outage, and a pull down on the digital power fail signal transitions the digital power fail signal on modular communication card from HIGH to LOW when the modular communication card is removed from the utility meter during normal operation of the utility meter;

the modular communication card comprising:

the power fail input configured to receive the digital power fail signal from the utility meter;

a power supply input configured to receive from the utility meter a power supply signal that powers components of the modular communication card while the modular communication card is installed on the utility meter;

a supercapacitor;

a charging circuit configured to charge the supercapaci-tor when the modular communication card is installed on the utility meter;

a boost circuit configured to provide a boosted voltage to a radio by boosting a voltage output of the supercapacitor;

the radio; and a controller configured to:

monitor a voltage associated with the supercapacitor and to control the charging circuit to charge the supercapacitor until the voltage reaches a thresh-old voltage;

detect a change in the digital power fail signal, wherein the change in the digital power fail signal indicates a loss of power due to either a power outage or a removal of the modular communica-tion card from the utility meter; and activate, based on the change to the digital power fail signal, an alert system integrated into the modular communication card, wherein the alert systems is configured to:

responsive to detecting that the power supply signal is outside an operational voltage range right after the detection of the change in the digital power fail signal:

determine that the loss of power is due to the modular communication card having been removed from the utility meter;

enable operation of the boost circuit to boost a voltage from the supercapacitor to provide a boosted voltage to a radio of the modular communication card;

wait for a sustained tamper duration which is pre-defined and preprogrammed in the modular commu-nication card; and transmit, by the radio of the modular communication card, an alert indicating the removal of the modular communication card from the utility meter and responsive to continuing to receive the power supply signal within the operational voltage range for at least two hundred milliseconds after the change in the digital power fail signal:

determine that the loss of power is due to a power outage;

responsive to the power supply signal being outside the operational voltage range, activate the boost circuit to boost a voltage from the supercapacitor to provide a boosted voltage to the radio of the modular communication card;

wait for a sustained outage duration which is predefined and preprogrammed in the modular communication card; and transmit, by the radio of the modular communication card, an alert indicating a power outage.

7. The system of claim 6, the modular communication card wherein the controller is further configured to: enable the charging circuit to charge the supercapacitor while the modular communication card is installed on the utility meter, responsive the digital power fail signal being in a first state and the power supply signal being within an operational voltage range.

8. The system of claim 6, wherein the controller of the modular communication card is further configured to:

detect a second change in the digital power fail signal, wherein the second change of the digital power fail signal indicates a second loss of power;

detect that the power supply signal is within an operational voltage range;

responsive to the change in the digital power fail signal and the power supply signal being within the operational voltage range, determine that the utility meter has experienced a power outage; and direct the radio to transmit a second alert indicating the power outage.

* * * * *